(12) United States Patent
Kwon et al.

(10) Patent No.: US 8,803,416 B2
(45) Date of Patent: Aug. 12, 2014

(54) ORGANIC LIGHT EMITTING DISPLAY APPARATUS AND METHOD OF MANUFACTURING ORGANIC LIGHT EMITTING DISPLAY APPARATUS

(71) Applicant: Samsung Display Co., Ltd., Yongin (KR)

(72) Inventors: Do-Hyun Kwon, Yongin (KR); Il-Jeong Lee, Yongin (KR); Choong-Youl Im, Yongin (KR); Dae-Hyun No, Yongin (KR); Cheol-Ho Yu, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/067,341

(22) Filed: Oct. 30, 2013

(65) Prior Publication Data

US 2014/0057378 A1 Feb. 27, 2014

Related U.S. Application Data

(60) Continuation of application No. 13/464,653, filed on May 4, 2012, now Pat. No. 8,591,280, which is a division of application No. 12/510,547, filed on Jul. 28, 2009, now Pat. No. 8,207,662.

(30) Foreign Application Priority Data

Aug. 19, 2008 (KR) ........................ 10-2008-0081069

(51) Int. Cl.
*H01J 1/62* (2006.01)
*H01J 63/04* (2006.01)
*H01J 17/49* (2012.01)
*H01L 27/32* (2006.01)
*H01J 9/26* (2006.01)
*H01L 51/50* (2006.01)

(52) U.S. Cl.
CPC ......... *H01L 27/3244* (2013.01); *H01L 27/3246* (2013.01); *H01J 9/261* (2013.01); *H01L 51/5012* (2013.01)

USPC .......... 313/503; 313/483; 313/500; 313/501; 313/502; 313/504; 313/505; 313/506

(58) Field of Classification Search
None
See application file for complete search history.

(56) References Cited

U.S. PATENT DOCUMENTS

| 7,042,546 B2 | 5/2006 | Tamashiro et al. |
| 8,207,662 B2 | 6/2012 | Kwon et al. |

(Continued)

FOREIGN PATENT DOCUMENTS

| JP | 2005-017333 | 1/2005 |
| KR | 10-0728790 | 6/2007 |
| KR | 10-0787461 | 12/2007 |

OTHER PUBLICATIONS

Korean Registration Determination Certificate issued on May 31, 2010 in Korean Patent Application No. 10-2008-0081069.

(Continued)

*Primary Examiner* — Natalie Walford
(74) *Attorney, Agent, or Firm* — H.C. Park & Associates, PLC

(57) ABSTRACT

An organic light emitting display (OLED) apparatus and a method of manufacturing the same, the OLED apparatus including: a substrate; an active layer formed on the substrate; a gate electrode insulated from the active layer; source and drain electrodes insulated from the gate electrode and electrically connected to the active layer; a pixel defining layer formed on the source and drain electrodes, having an aperture to expose one of the source and drain electrodes; an intermediate layer formed in the aperture and comprising an organic light emitting layer; and a facing electrode which is formed on the intermediate layer. One of the source and drain electrodes has an extension that operates as a pixel electrode. The aperture exposes the extended portion. The intermediate layer is formed on the extended portion.

7 Claims, 7 Drawing Sheets

(56) References Cited

U.S. PATENT DOCUMENTS 8,597,280 B2 * 12/2013 Cooper et al. .................. 606/1
2007/0052352 A1 3/2007 Im et al.

OTHER PUBLICATIONS

Korean Office Action issued on Nov. 30, 2009 in Korean Patent Application No. 10-2008-0081069.
Non-Final Office Action issued on Feb. 18, 2011 in U.S. Appl. No. 12/510,547.
Final Office Action issued on Aug. 11, 2011 in U.S. Appl. No. 12/510,547.
Notice of Allowance issued on Mar. 20, 2012 in U.S. Appl. No. 12/510,547.
Non-Final Office Action issued on Oct. 11, 2012 in U.S. Appl. No. 13/464,653.
Final Office Action issued on Feb. 7, 2013 in U.S. Appl. No. 13/464,653.
Notice of Allowance issued on Jul. 24, 2013 in U.S. Appl. No. 13/464,653.
Supplemental Notice of Allowance issued on Aug. 30, 2013 in U.S. Appl. No. 13/464,653.

* cited by examiner

US 8,803,416 B2

ORGANIC LIGHT EMITTING DISPLAY APPARATUS AND METHOD OF MANUFACTURING ORGANIC LIGHT EMITTING DISPLAY APPARATUS

CROSS-REFERENCE TO RELATED APPLICATIONS

This application is a continuation of U.S. patent application Ser. No. 13/464,653, filed on May 4, 2012, which is a divisional of U.S. patent application Ser. No. 12/510,547, filed on Jul. 28, 2009, now issued as U.S. Pat. No. 8,207,662, and claims priority from and the benefit of Korean Patent Application No. 10-2008-0081069, filed on Aug. 19, 2008, all of which are hereby incorporated by reference for all purposes as if fully set forth herein.

BACKGROUND OF THE INVENTION

1. Field of the Invention

Aspects of the present invention relate to an organic light emitting display (OLED) apparatus and a method of manufacturing the OLED apparatus.

2. Description of the Related Art

Many current electronic devices include a thin, flat-panel display apparatus. Such flat-panel display apparatuses can be classified as organic or inorganic light emitting display apparatuses, which are self-emitting display apparatuses that are regarded as next generation display apparatuses, due to having wide viewing angles, excellent contrast, and fast response speeds. Organic light-emitting display apparatuses, which include light emitting layers formed of an organic material to display various colors, have improved luminance, reduced driving voltages, and higher response speeds, in comparison to the inorganic light emitting display apparatuses.

An organic light emitting display apparatus includes an organic light emitting diode, in which cathode and anode electrodes are formed adjacent to an organic light emitting layer. When a voltage is applied to the cathode and anode electrodes, the organic light emitting layer, which is connected to the cathode and anode electrodes, generates visible light.

An organic light emitting display apparatus includes a plurality of thin films, which are precisely patterned. A large number of processes are performed, in order to form such patterns. The patterns may be formed by using various methods, such as photolithography using a mask.

Photolithography should be precisely controlled. Also, various operations, such as photo resist formation, exposure, developing, and etching are performed to form a pattern using a mask. Thus, such photolithography methods are complicated time consuming and are difficult to control, which can result in the production of a large number of defects. Also, the total thickness of an organic light emitting display apparatus produced by such processes is relatively thick, due to the multitude of stacked films.

SUMMARY OF THE INVENTION

Aspects of the present invention provide an organic light emitting display (OLED) apparatus that is relatively thin and simple to manufacture, and a method of manufacturing the OLED apparatus.

According to an aspect of the present invention, there is provided an organic light emitting display (OLED) apparatus including: a substrate; an active layer formed on the substrate; a gate electrode that is insulated from the active layer; source and drain electrodes that are insulated from the gate electrode and electrically connected to the active layer; a pixel defining layer formed on the source and drain electrodes, which include an aperture to expose one of the source and drain electrodes; an intermediate layer that is formed in the aperture and includes an organic light emitting layer; and a facing electrode that is formed on the intermediate layer. One of the source and drain electrodes has an extended portion and can thereby operate as a pixel electrode. The aperture exposes the extended portion, and the intermediate layer is connected thereto, through the aperture.

According to aspects of the present invention, the pixel defining layer may be formed of an inorganic material.

According to aspects of the present invention, an overcoat film may be formed on the gate electrode, to insulate the gate electrode from the source and drain electrodes. The source and drain electrodes may be formed on the overcoat film.

According to aspects of the present invention, the OLED apparatus may further include a spacer formed on the pixel defining layer, so as to expose the aperture. The facing electrode may be formed above the pixel defining layer.

According to aspects of the present invention, the OLED apparatus may further include: a first capacitor electrode, which is formed in the same plane and of the same material as the active layer; and a second capacitor electrode that is insulated from the first capacitor electrode and is formed on the first capacitor electrode, in the plane and from the same material as the gate electrode, so as to correspond to the first capacitor electrode.

According to aspects of the present invention, the first and second capacitor electrodes may be formed below the pixel electrode.

According to another aspect of the present invention, there is provided a method of manufacturing an organic light emitting display (OLED) apparatus, the method including: forming an active layer on a substrate; forming a gate electrode, so as to be insulated from the active layer; forming source and drain electrodes, so as to be insulated from the gate electrode and be electrically connected to the active layer; forming a pixel defining layer on the source and drain electrodes, which includes an aperture to expose one of the source and drain electrodes; forming an intermediate layer, which includes an organic light emitting layer, in the aperture; and forming a facing electrode on the intermediate layer. The forming of the source and drain electrodes includes forming an extended portion on one of the source and drain electrodes, such that it operates as a pixel electrode. The forming of the pixel defining layer includes forming the aperture such that it exposes the extended portion. The forming of the intermediate layer includes connecting the intermediate layer to the pixel electrode, through the aperture.

According to aspects of the present invention, the forming of the source and drain electrodes and the pixel defining layer may be performed using a single halftone mask.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
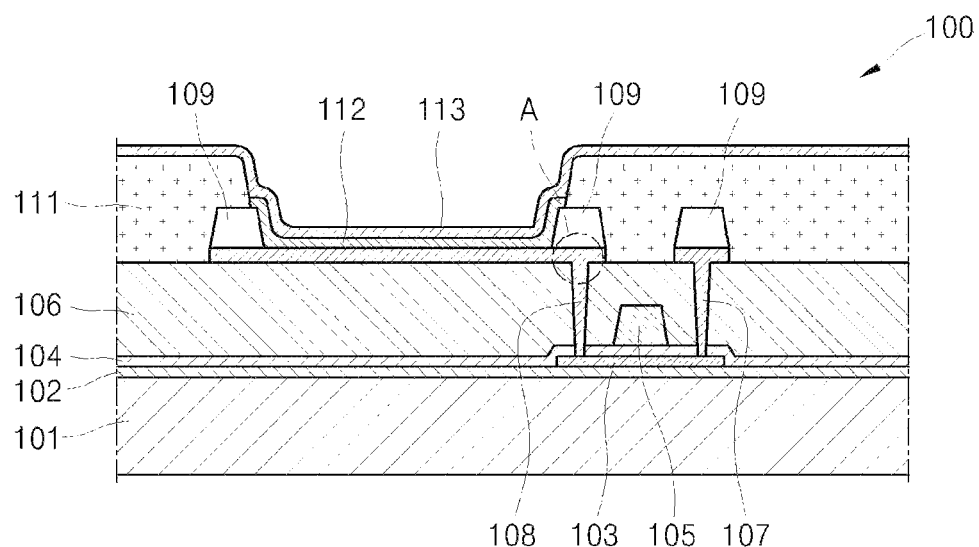
FIG. 1 is a schematic cross-sectional diagram of an organic light emitting display (OLED) apparatus, according to an exemplary embodiment of the present invention.

Reference will now be made in detail to the exemplary embodiments of the present invention, which are illustrated in the accompanying drawings, wherein like reference numerals refer to like elements throughout. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 2:
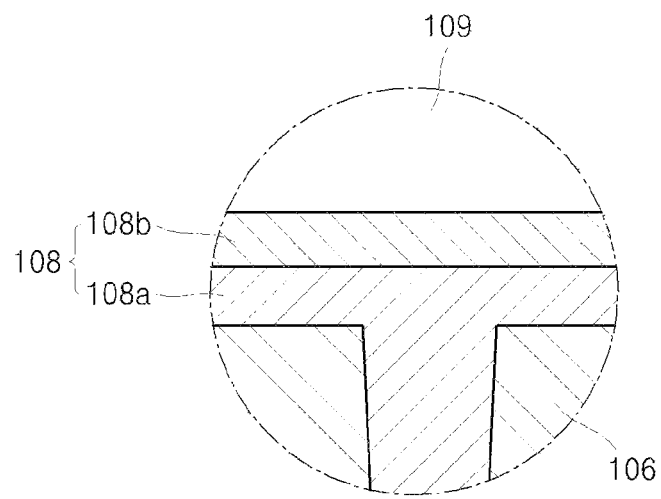
FIG. 2 is an enlarged view of portion A of FIG. 1.

FIG. 1 is a schematic cross-sectional diagram of an organic light emitting display (OLED) apparatus 100, according to an exemplary embodiment of the present invention. FIG. 2 shows portion A of FIG. 1. Referring to FIG. 1, the OLED apparatus 100 includes a substrate 101, an active layer 103, a gate electrode 105, a source electrode 107, a drain electrode 108, a pixel defining layer 109, a spacer 111, an intermediate layer 112, and a facing electrode 113.

The substrate 101 may be formed of a transparent glass material mainly containing $SiO_2$. However, the substrate 101 is not limited thereto and may be formed of a transparent plastic material, for example. The plastic material may be an organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose triacetate (TAC), and cellulose acetate propionate (CAP), for example.

If the OLED apparatus 100 is a bottom emission-type, in which an image is projected through the substrate 101, the substrate 101 is formed of a transparent material. However, if the OLED apparatus 100 is a top emission-type, in which an image is projected away from the substrate 101, the substrate 101 may be formed of an opaque or semi-transparent material, such as a metal. If the substrate 101 is formed of a metal, the substrate 101 may include at least one selected from the group consisting of carbon (C), iron (Fe), manganese (Mn), nickel (Ni), titanium (Ti), molybdenum (Mo), and stainless steel (SUS). The substrate 101 may also be formed of an alloy, such as Invar, Inconel, or Kovar. However, the substrate 101 is not limited thereto, and may be formed of, for example, a metallic foil.

In order to planarize the substrate 101 and prevent impure elements from diffusing into the substrate 101, a buffer layer 102 may be formed on the substrate 101. The buffer layer 102 may be formed of, for example, $SiO_2$ and/or $SiN_x$.

A thin film transistor (TFT) is formed on the buffer layer 102. Each pixel of the OLED apparatus 100 includes at least one TFT that is electrically connected to the intermediate layer 112. In FIG. 1, for convenience of explanation, only one TFT is illustrated. However, the number of TFTs is not so limited, and each pixel may include a plurality of TFTs.

In more detail, the active layer 103 forms a predetermined pattern on the buffer layer 102. The active layer 103 may be formed of an organic semiconductor, or an inorganic semiconductor, such as amorphous silicon, or polysilicon. The active layer 103 includes a source region, a drain region, and a channel region.

The source and drain regions may be formed by doping an impurity into the active layer 103. A P-type semiconductor may be obtained, if the active layer 103 is doped with a group 13 element, for example, boron (B), and an N-type semiconductor may be obtained if the active layer 103 is doped with a group 15 element, for example, nitrogen (N).

A gate insulating film 104 is formed on the active layer 103. The gate electrode 105 is formed on a portion of the gate insulating film 104. The gate insulating film 104 is used to insulate the active layer 103 from the gate electrode 105 and may be formed of an organic material or an inorganic material, such as $SiN_x$ or $SiO_2$.

The gate electrode 105 may be formed of a metal, such as gold (Au), silver (Ag), copper (Cu), Ni, platinum (Pt), palladium (Pd), aluminum (Al), or Mo; or an alloy, such as an Al:Nd alloy or an Mo:W alloy. However, the gate electrode 105 is not limited thereto, and may be formed of various materials, in consideration of the adhesion with neighboring layers, the planarization of stacked layers, the electric resistance, the proccessability thereof, and so on. The gate electrode 105 is connected to a gate line (not shown) that applies on/off signals to the TFT.

An overcoat film 106 including contact holes is formed on the gate electrode 105. The overcoat film 106 may be an organic insulating film or an inorganic insulating film containing an oxide or a nitride.

The inorganic insulating film may be formed of $SiO_2$, $SiN_x$, SiON, $Al_2O_3$, $TiO_2$, $Ta_2O_5$, $HfO_2$, $ZrO_2$, barium strontium titanate (BST), or lead zirconate titanate (PZT), for example. The organic insulating film may be formed of a commercially available polymer, such as polymethylmethacrylate (PMMA) or polystyrene (PS), a polymer derivative containing a phenol group, an acryl-based polymer, an imide-based polymer, an arylether-based polymer, an amide-based polymer, a fluorine-based polymer, a p-xylene-based polymer, a vinyl alcohol-based polymer, or a mixture thereof, for example. The overcoat film 106 may have a stacked structure, in which the organic and inorganic films are stacked on one another.

Unlike a typical interlayer insulating film, the overcoat film 106 is planar, because one of the source and drain electrodes 107 and 108 operates as a pixel electrode. The intermediate layer 112, on which an image may be displayed, is formed on the pixel electrode. If the intermediate layer 112 is not planar, image quality is reduced. According to the current exemplary embodiment of the present invention, a lower surface of the intermediate layer 112 may be planarized, by forming the overcoat film 106 thereon.

The source and drain electrodes 107 and 108 may respectively contact the source and drain regions of the active layer 103, through the contact holes. One of the source and drain electrodes 107 and 108 has an extended portion, which allows it to operate as a pixel electrode. According to the current exemplary embodiment of the present invention, the drain electrode 108 is shown as having the extended portion, which contacts the intermediate layer 112. The drain electrode 108 may be referred to as a pixel electrode. However, the present invention is not limited thereto, and the source electrode 107 may instead have such an extended portion, so as to operate as the pixel electrode.

The source and drain electrodes 107 and 108 may be formed of a metal such as Au, Pd, Pt, Ni, rhodium (Rh), ruthenium (Ru), iridium (Ir), osmium (Os), Al, or Mo; or a metal alloy such as an Al:Nd alloy or an MoW alloy. Each of the source and drain electrodes 107 and 108 may have a layered structure, in which a transparent conductive layer is formed on a reflective metal layer. The drain electrode 108 will be described in detail, with reference to FIG. 2.

Referring FIG. 2, the drain electrode 108 includes first and second layers 108a and 108b. The first layer 108a contacts and extends from the active layer 103, and the second layer 108b is formed on the first layer 108a and extends orthogonally therefrom.

The first layer 108a may be a reflective conductive film, and the second layer 108b may be a transparent conductive film. The reflective conductive film may be formed of a metal such as Au, Pd, Pt, Ni, Rh, Ru, Ir, Os, Al, or Mo; or a metal alloy such as an Al:Nd alloy or an MoW alloy. The transparent conductive film may be formed of a material having a high work function value, which includes at least one selected from the group consisting of indium tin oxide (ITO), indium zinc oxide (IZO), zinc oxide (ZnO), and $In_2O_3$.

Referring back to FIG. 1, when each of the source and drain electrodes 107 and 108 is formed from two layers, and thus, because a material having a high work function value covers an upper surface of each of the source and drain electrodes 107 and 108, the pixel electrode may operate as an anode electrode. According to the current exemplary embodiment of the present invention, a separate process for forming a pixel electrode is not required.

Conventionally, both an interlayer insulating film to insulate the gate electrode 105 from the source and drain electrodes 107 and 108, and a passivation film to cover the source and drain electrodes 107 and 108, are needed. However, according to the current exemplary embodiment of the present invention, only the overcoat film 106 is used. As such, the OLED apparatus 100 may be thinner and easier to manufacture.

The pixel defining layer 109 is formed on the source and drain electrodes 107 and 108, so as to expose sides of the source and drain electrodes 107 and 108. The pixel defining layer 109 includes an aperture to expose the extended portion of the drain electrode 108.

The pixel defining layer 109 may be formed of an inorganic material including one selected from the group consisting of $SiO_2$, $SiN_x$, SiON, and $Al_2O_3$. Since the pixel defining layer 109 is formed of an inorganic material, metal patterns of a driving circuit unit, which are formed in the same plane and of the same material as the source and drain electrodes 107 and 108, are not damaged during a sealing process.

In more detail, according to the current exemplary embodiment of the present invention, one of the source and drain electrodes 107 and 108 operates as the pixel electrode, and the source and drain electrodes 107 and 108 contact the pixel defining layer 109. The metallic patterns of the driving circuit unit, at an edge of the OLED apparatus 100, are also formed at the same level and of the same material as the source and drain electrodes 107 and 108, so as to contact the pixel defining layer 109.

If the pixel defining layer 109 is formed of an organic material, the metallic patterns may be damaged by the organic material, during a subsequent encapsulating process. However, according to the current exemplary embodiment of the present invention, the pixel defining layer 109 is formed of an inorganic material, and thus, the metal patterns of the driving circuit unit are not damaged during the encapsulating process. The spacer 111 is formed on the pixel defining layer 109 and exposes the pixel electrode through the pixel defining layer 109. The spacer 111 may be formed of an organic material or an inorganic material. For example, the spacer 111 may include one selected from the group consisting of an imide-based material, benzo cyclo butene (BCB), acryl, cytop, and perfluorocyclobutene (PFCB).

The intermediate layer 112 including an organic light emitting layer is formed on the drain electrode 108, which is exposed through the pixel defining layer 109. The facing electrode 113 is formed on the intermediate layer 112. The facing electrode 113 may also be formed on the spacer 111, so as to cover all pixels, and may operate as a cathode electrode.

If the OLED apparatus 100 is a top emission type, the facing electrode 113 may be formed by depositing a metal having a low work function value, such as Ag, magnesium (Mg), Al, Pt, Pd, Au, Ni, neodymium (Nd), Ir, chromium (Cr), lithium (Li), calcium (Ca), or a mixture thereof, and then depositing a transparent conductive material, such as ITO, IZO, ZnO, or $In_2O_3$, on the metal.

If the OLED apparatus 100 is a top and bottom emission type, the source and drain electrodes 107 and 108, and the facing electrode 113 may be transparent. If the OLED apparatus 100 is a bottom emission type, the source and drain electrodes 107 and 108 may be transparent, and the facing electrode 113 may be reflective.

The intermediate layer 112 is disposed between the drain electrode 108 and the facing electrode 113 and includes the organic light emitting layer that generates visible light. The intermediate layer 112 emits light, according to voltages applied to the facing electrode 113 and the drain electrode 108.

The intermediate layer 112 may be formed of an organic material. If the organic light emitting layer of the intermediate layer 112 is formed of a low molecular weight organic material, a hole transport layer (HTL) and a hole injection layer (HIL) are stacked on one another, in a direction toward the drain electrode 108, with reference to the organic light emitting layer. An electron transport layer (ETL) and an electron injection layer (EIL) are stacked on one another, in a direction toward the facing electrode 113. In addition to the above-mentioned layers, various other layers may be stacked. The low molecular weight organic material forming the intermediate layer 112 may be, for example, copper phthalocyanine (CuPc), N, N'-Di(naphthalene-1-yl)-N,N'-diphenyl-benzidine (NPB), or tris-8-hydroxyquinoline aluminum ($Alq_3$).

Meanwhile, if the organic light emitting layer of the intermediate layer 112 is formed of a polymer material, the HTL may be formed in a direction toward the drain electrode 108, with reference to the organic light emitting layer. In this case, the HTL may be formed of, for example, poly-(2,4)-ethylene-dihydroxy thiophene (PEDOT) or polyaniline (PANI), on the drain electrode 108, by using an inkjet printing method or a spin coating method. The organic light emitting layer may be formed of, for example, polyphenylene vinylene (PPV), soluble PPV's, cyano-PPV, polyfluorene. A color pattern may be formed by using any suitable method, such as inkjet printing, spin coating, or laser-induced thermal imaging.

A sealing member (not shown) may be arranged to face one surface of the substrate 101. The sealing member protects the intermediate layer 112 from external moisture and/or oxygen, and is formed of a transparent material. The sealing member may be formed of a stack of different materials, such as glass and plastic, or organic and inorganic materials.

FIGS. 3 through 13 are schematic cross-sectional views sequentially illustrating a method of manufacturing the OLED apparatus 100, according to an exemplary embodiment of the present invention. FIGS. 3 through 13 will be described in conjunction with FIG. 1. Although the OLED apparatus 100 illustrated in FIG. 1 will be referred to, in order to describe the exemplary method, the aspects of the method may be applied to other types of OLED apparatuses.

The method includes: forming the active layer 103 on the substrate 101; forming the gate electrode 105; forming the source and drain electrodes 107 and 108; forming the pixel defining layer 109 on the source and drain electrodes 107 and 108; forming the spacer 111 on the pixel defining layer 109; forming the intermediate layer 112; and forming the facing electrode 113.

Figure 3:
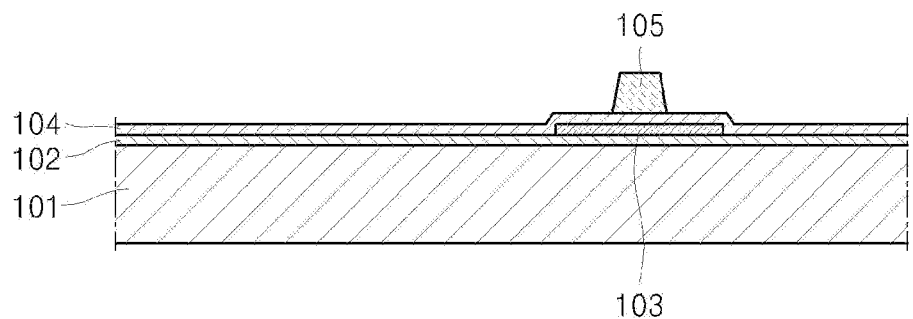
FIGS. 3 through 13 are schematic cross-sectional diagrams sequentially showing a method of manufacturing the OLED apparatus of FIG. 1, according to an exemplary embodiment of the present invention.

Referring to FIG. 3, the buffer layer 102 is formed on the substrate 101, and the active layer 103 is formed on the buffer layer 102. The gate insulating film 104 is formed on the active layer 103, and the gate electrode 105 is formed on the gate insulating film 104. As shown in FIG. 3, the active layer 103 is formed to have a pattern. The active layer 103 may be formed using a photolithography method.

Figure 4:
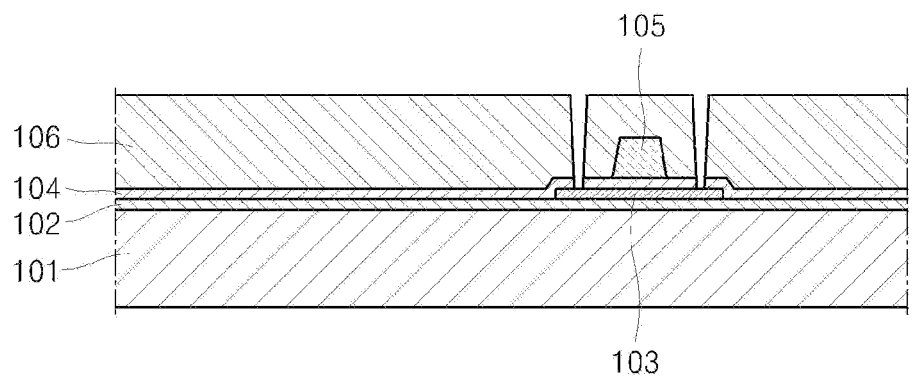

Referring to FIG. 4, the overcoat film 106 is formed, so as to cover the gate electrode 105. Contact holes are formed in the overcoat film 106, to expose source and drain regions of the active layer 103. The contact holes may be formed using photolithography.

Figure 5:
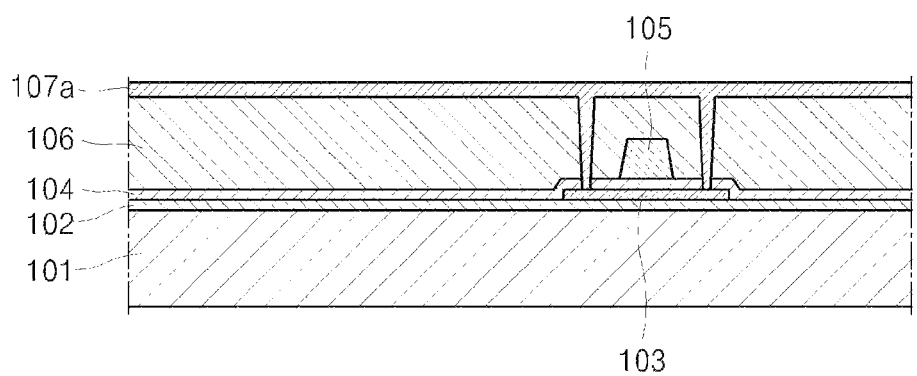

Referring to FIG. 5, a conductive layer 107a is deposited, which is patterned to form the source and drain electrodes 107 and 108. The conductive layer 107a can be formed of the same materials as recited above for the source and drain electrodes 107 and 108. Although not shown, the conductive layer 107a may be formed of two layers, such as the first and second layers 108a and 108b illustrated in FIG. 2.

Figure 6:
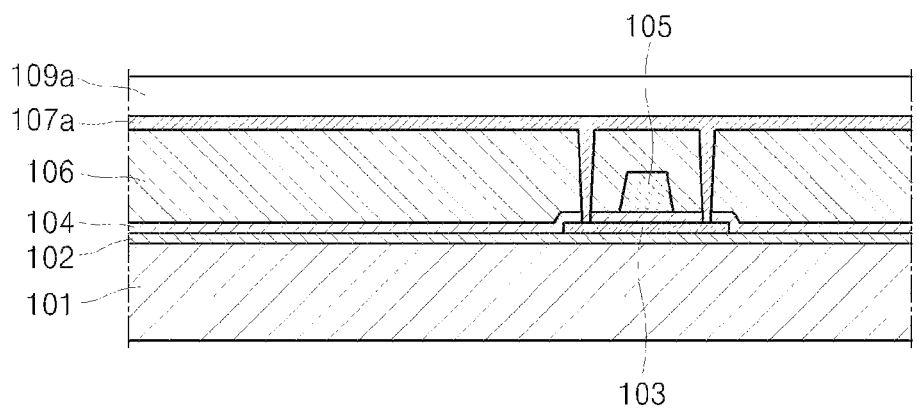

Referring to FIG. 6, an inorganic layer 109a is deposited on the conductive layer 107a. The inorganic layer 109a can be formed of the same materials as described above for the pixel defining layer 109.

Figure 7:
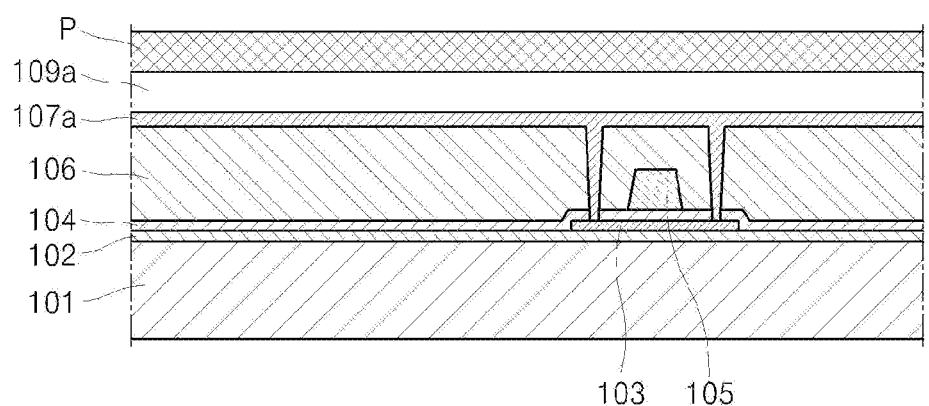

Referring to FIG. 7, a photo resist P and a halftone mask HM are prepared, for use in performing a photolithography method. The halftone mask HM includes a light transmission unit HM1, a light blocking unit HM2, and a half transmission unit HM3.

The light transmission unit HM1 transmits light of a predetermined wavelength range, the light blocking unit HM2 blocks projected light, and the half transmission unit HM3 transmits only a portion of the projected light. The halftone mask HM is arranged on the substrate 101, in order to pattern the photo resist P. Light is projected on the substrate 101, through the halftone mask HM.

Figure 8:
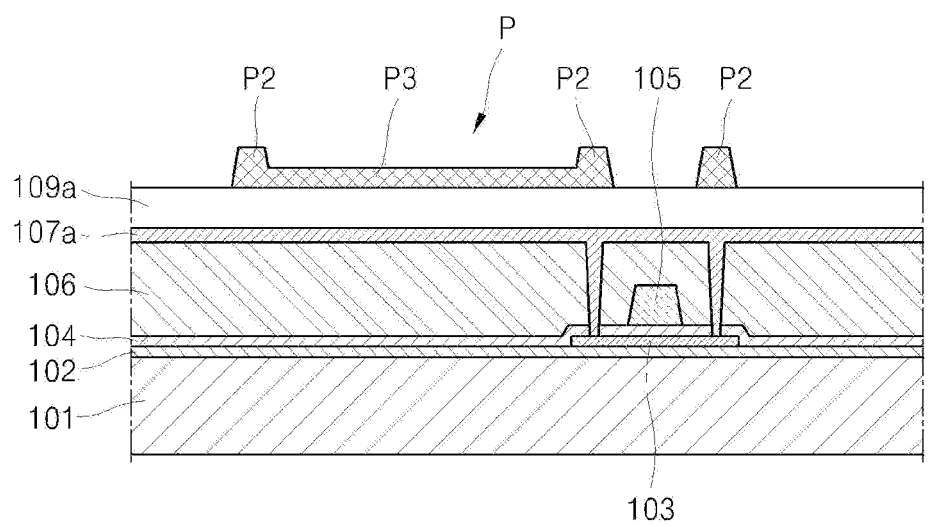

The photo resist P is illustrated in FIG. 8, after the light is projected. For convenience of explanation, a positive photo resist (PR) will now be exemplarily described as the photo resist P. However, the present invention is not limited to the positive PR, for example, a negative PR may be used.

Referring to FIG. 8, a portion corresponding to the light transmission unit HM1 is removed from the photo resist P, and a portion P2 corresponding to the light blocking unit HM2 and a portion P3 corresponding to the half transmission unit HM3 remain. In this case, the portion P3 is thinner than the portion P2.

Figure 9:
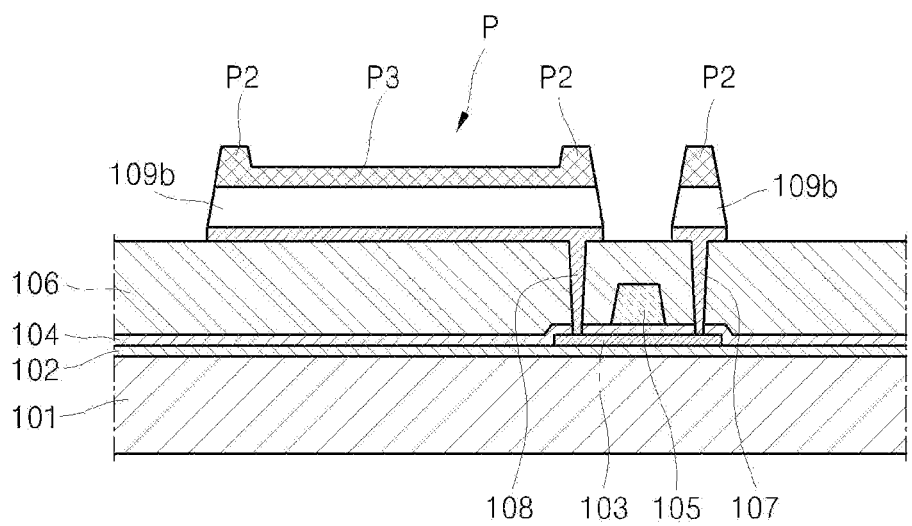

Referring to FIG. 9, the conductive layer 107a is etched according to the pattern of the photo resist P, so as to form the source and drain electrodes 107 and 108. The inorganic layer 109a is also etched, so as to form an inorganic pattern 109b corresponding to the source and drain electrodes 107 and 108. In this case, one of the source and drain electrodes 107 and 108 includes an extended portion, so as to operate as a pixel electrode. According to the current exemplary embodiment of the present invention, the drain electrode 108 has the extended portion.

Figure 10:
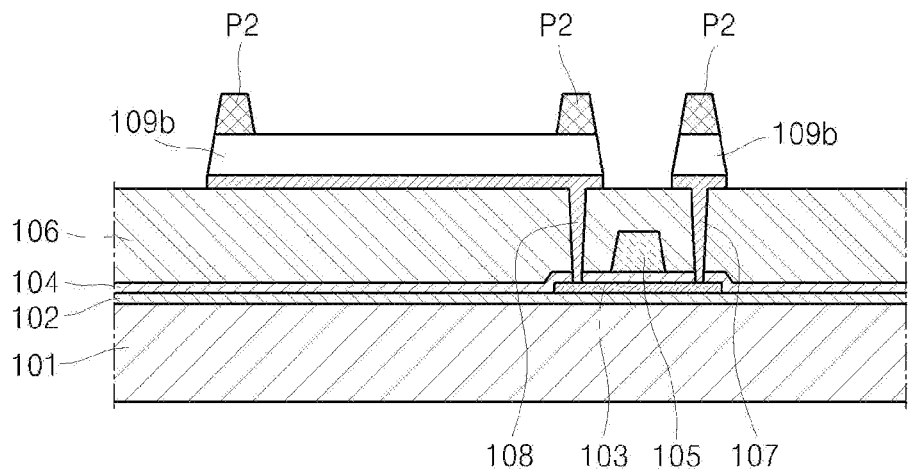

Referring to FIG. 10, the portion P3, corresponding to the half transmission unit HM3, is removed. Thus, a portion of the inorganic pattern 109b is exposed, and only the portion P2, corresponding to the light blocking unit HM2, remains. In this case, an upper surface of the portion P2 may be etched to reduce the thickness thereof. The above process may be performed using an ashing process, without an additional mask.

Figure 11:
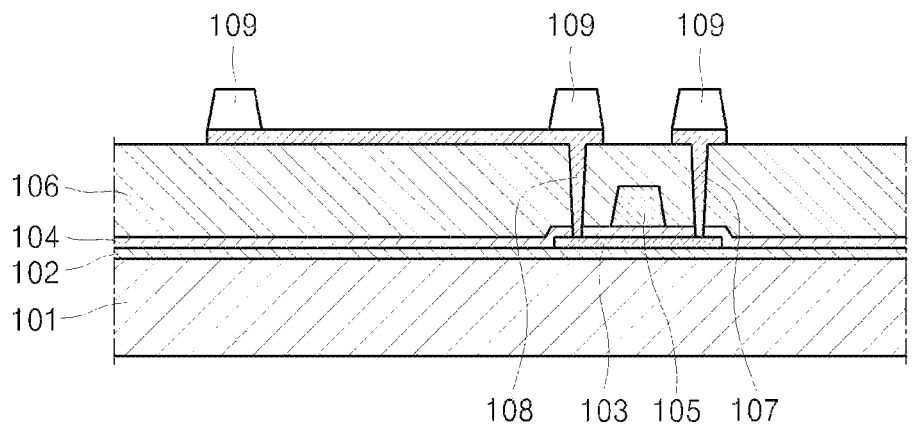

Referring to FIG. 11, the exposed portion of the inorganic pattern 109b is etched, so as to form the pixel defining layer 109 having the aperture. The portion P2 is then completely removed.

Figure 12:
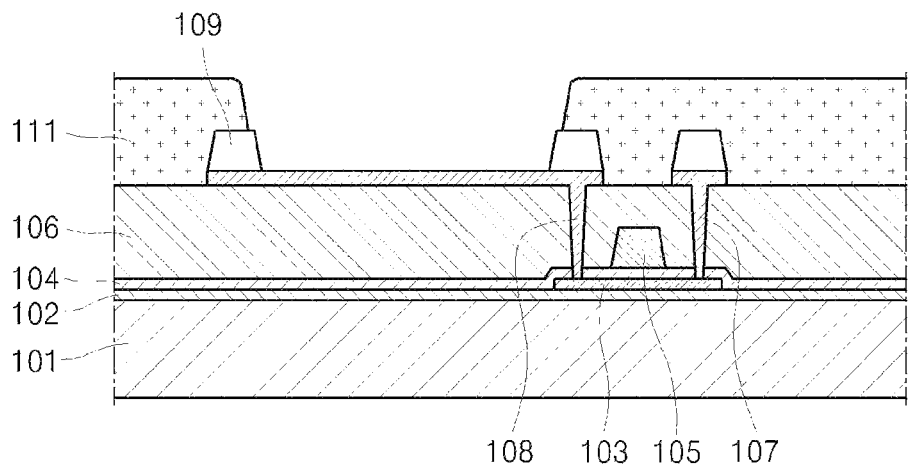

Referring to FIG. 12, the spacer 111 is formed, so as to expose the aperture of the pixel defining layer 109. Photolithography may be used to pattern the spacer 111.

Figure 13:
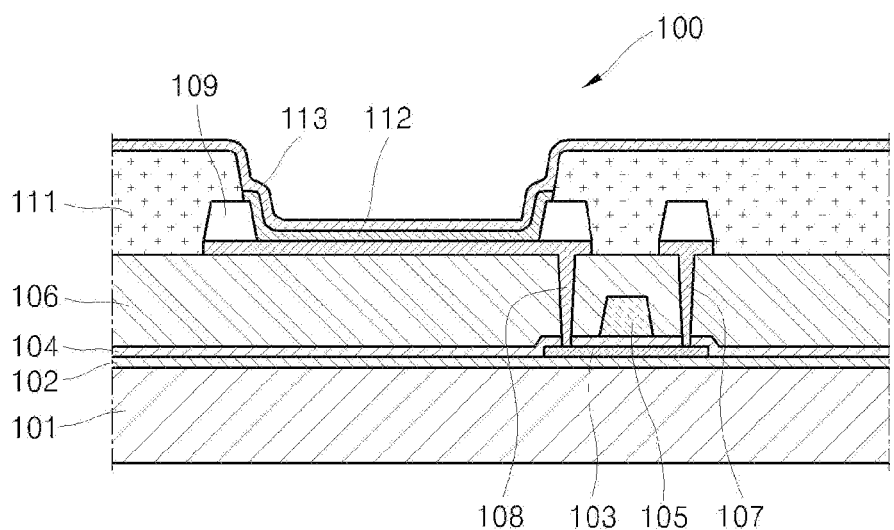

Referring to FIG. 13, the intermediate layer 112 is formed on the extended portion of the drain electrode 108, which is exposed through the aperture of the pixel defining layer 109. The intermediate layer 112 includes an organic light emitting layer. The facing electrode 113 is then formed on the intermediate layer 112.

Although not shown, a sealing member (not shown) may be arranged to face one surface of the substrate 101. The sealing member protects the intermediate layer 112 from external moisture and/or oxygen, and is formed of a transparent material, as described above.

According to the current exemplary embodiment of the present invention, one of the source and drain electrodes 107 and 108 has an extended portion and operates as the pixel electrode, such that an additional process is not needed to form the pixel electrode. In particular, a photographic process for patterning the pixel electrode is not required, to simplify manufacturing and lower a defect rate thereof. Also, the source and drain electrodes 107 and 108 and the pixel defining layer 109 may be formed using a single halftone mask HM.

Figure 14:
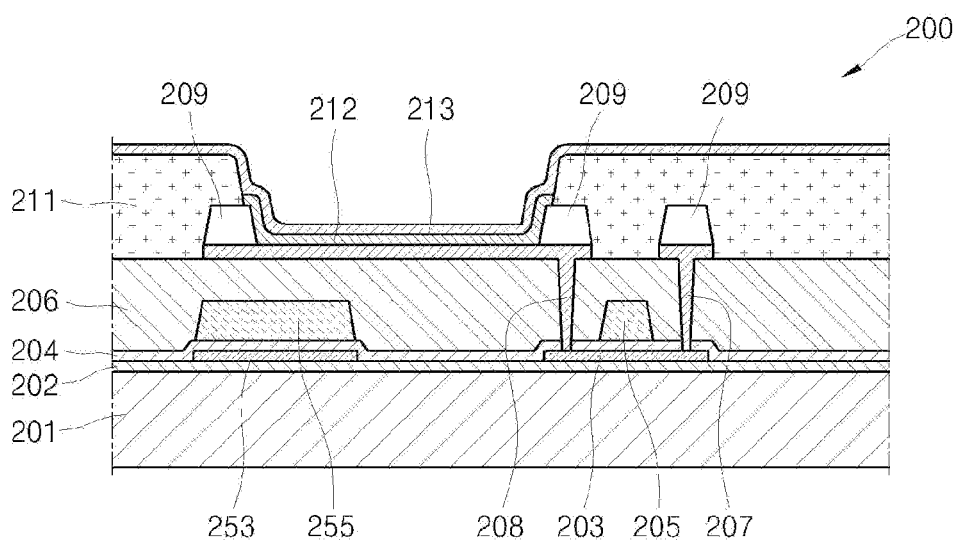
FIG. 14 is a schematic cross-sectional diagram of an OLED apparatus, according to another exemplary embodiment of the present invention.

FIG. 14 is a schematic cross-sectional diagram of an OLED apparatus 200, according to another exemplary embodiment of the present invention. Referring to FIG. 14, the OLED apparatus 200 includes a substrate 201, an active layer 203, a gate electrode 205, a source electrode 207, a drain electrode 208, a pixel defining layer 209, a spacer 211, an intermediate layer 212, a facing electrode 213, a first capacitor electrode 253, and a second capacitor electrode 255.

Elements of the OLED apparatus 200, other than the first and second capacitor electrodes 253 and 255, are similar to the elements of the OLED apparatus 100. Thus, a detailed description of the similar elements is omitted.

A buffer layer 202 may be formed on the substrate 201. The active layer 203, which is patterned, is formed on the buffer layer 202.

The first capacitor electrode 253 is formed on the buffer layer 202, of the same material as the active layer 203. The active layer 203 and the first capacitor electrode 253 may be simultaneously patterned using a single mask.

A gate insulating film 204 is formed on the active layer 203. The first capacitor electrode 253, the gate electrode 205, and the second capacitor electrode 255 are formed on the gate insulating film 204.

The second capacitor electrode 255 is formed of the same material as the gate electrode 205. The gate electrode 205 and the second capacitor electrode 255 may be simultaneously patterned, using a single mask.

According to the current exemplary embodiment of the present invention, the first and second capacitor electrodes 253 and 255 may be formed without using additional masks. The active layer 203 and the first capacitor electrode 253 are formed in the same plane, and the gate electrode 205 and the second capacitor electrode 255 are formed in the same plane. Therefore, additional layers for the first and second capacitor electrodes 253 and 255 may not be required. Thus, the thickness of the OLED apparatus 200 is reduced.

The first and second capacitor electrodes 253 and 255 are formed below an extended portion of the drain electrode 208. As such, a top emission structure may prevent a reduction in aperture ratio and luminance. A bottom emission structure may prevent a reduction in aperture ratio and luminance, by forming the first and second capacitor electrodes 253 and 255, so as not to correspond to the extended portion of the drain electrode 208.

According to the current exemplary embodiment of the present invention, one of the source and drain electrodes 207 and 208 has an extended portion, and operates as a pixel electrode, such that an additional process for forming the pixel electrode is not required. In particular, thin films for forming the pixel electrode, such as a conductive layer and an insulating layer, are not required, and thus, the thickness of the OLED apparatus 200 may be relatively reduced.

Although not shown, the method described above with reference to FIGS. 3 through 23 may be used to manufacture the OLED apparatus 200. Thus, the source and drain electrodes 207 and 208 and the pixel defining layer 209 may be formed using a single halftone mask.

Although not shown, a sealing member may be arranged to face one surface of the substrate 201. The sealing member is transparent and protects the intermediate layer 212 from external moisture and/or oxygen. The sealing member may have a similar structure to the previously described sealing member. According to aspects of the present invention, a thin OLED apparatus may be more easily manufactured.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A method of manufacturing an organic light emitting display (OLED) apparatus, the method comprising:
    forming an active layer on a substrate;
    forming a gate electrode on the substrate, so as to be insulated from the active layer;
    forming a first electrode on the substrate, so as to be insulated from the gate electrode and be electrically connected to the active layer, the first electrode having an extended portion that operates as a pixel electrode;
    forming a second electrode on the substrate, so as to be insulated from the gate electrode and be electrically connected to the active layer;
    forming a pixel defining layer on upper surfaces of the first electrode and the second electrode such that the pixel defining layer does not directly contact side surfaces of the first electrode and the second electrode, the pixel defining layer having an aperture that exposes the extended portion;
    forming an intermediate layer comprising an organic light emitting layer, in the aperture and connected to the extended portion; and
    forming a facing electrode on the intermediate layer,
    wherein one of the first and second electrodes is a source electrode, and the other is a drain electrode.

2. The method of claim 1, wherein the pixel defining layer comprises an inorganic material.

3. The method of claim 1, further comprising forming an overcoat film on the gate electrode, before the first and second electrodes are formed, to insulate the gate electrode from the first and second electrodes.

4. The method of claim 1, further comprising forming a spacer on the pixel defining layer, which has an opening to expose the aperture, before the intermediate layer is formed,
    wherein the forming of the facing electrode comprises forming the facing electrode on the spacer, such that the facing electrode is separated from the pixel defining layer.

5. The method of claim 1, wherein:
    the forming of the active layer further comprises forming a first capacitor electrode in the same plane and of the same material as the active layer, and
    the forming of the gate electrode further comprises forming a second capacitor electrode that is insulated from the first capacitor electrode, on the first capacitor electrode, in the same plane and of the same material as the gate electrode.

6. The method of claim 5, wherein the first capacitor electrode faces the extended portion.

7. The method of claim 1, wherein the extended portion of the first electrode extends away from the second electrode and faces the intermediate layer.

* * * * *